(12) United States Patent
Wang

(10) Patent No.: US 10,332,574 B2
(45) Date of Patent: Jun. 25, 2019

(54) EMBEDDED MEMORY WITH SETUP-HOLD TIME CONTROLLED INTERNALLY OR EXTERNALLY AND ASSOCIATED INTEGRATED CIRCUIT

(71) Applicant: MEDIATEK INC., Hsin-Chu (TW)

(72) Inventor: Chia-Wei Wang, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/818,768

(22) Filed: Nov. 21, 2017

(65) Prior Publication Data

US 2018/0277179 A1  Sep. 27, 2018

Related U.S. Application Data

(60) Provisional application No. 62/475,973, filed on Mar. 24, 2017.

(51) Int. Cl.
| | | |
|---|---|---|
| G11C 8/10 | (2006.01) | |
| G11C 7/22 | (2006.01) | |
| G11C 7/10 | (2006.01) | |
| G11C 8/06 | (2006.01) | |
| G11C 8/18 | (2006.01) | |
| G06F 17/50 | (2006.01) | |
| G11C 7/12 | (2006.01) | |
| G06F 13/16 | (2006.01) | |

(52) U.S. Cl.
CPC .......... *G11C 7/222* (2013.01); *G06F 17/5045* (2013.01); *G11C 7/1006* (2013.01); *G11C 7/109* (2013.01); *G11C 7/1078* (2013.01); *G11C 7/1093* (2013.01); *G11C 7/12* (2013.01); *G11C 8/06* (2013.01); *G11C 8/18* (2013.01); *G06F 13/1689* (2013.01)

(58) Field of Classification Search
CPC ...................................... G11C 7/222
USPC ....................... 365/189.02, 233.11
See application file for complete search history.

(56) References Cited

U.S. PATENT DOCUMENTS

| | | |
|---|---|---|
| 5,452,239 A | 9/1995 | Dai |
| 6,232,811 B1 | 5/2001 | Ihm |
| 6,310,506 B1 | 10/2001 | Brown |
| 6,577,175 B2 | 6/2003 | Kim |
| 6,924,685 B2 | 8/2005 | Bae |
| 8,514,002 B2 | 8/2013 | Ito |
| 2004/0056699 A1 | 3/2004 | Truong |
| 2008/0226004 A1 | 9/2008 | Oh |
| 2011/0187433 A1 | 8/2011 | Baumann |
| 2015/0332757 A1 | 11/2015 | Lin |
| 2015/0356048 A1* | 12/2015 | King ............... G06F 13/4221 710/308 |
| 2016/0191031 A1 | 6/2016 | Bhatia |

* cited by examiner

*Primary Examiner* — Hoai V Ho
(74) *Attorney, Agent, or Firm* — Winston Hsu

(57) ABSTRACT

An embedded memory includes a memory interface circuit, a cell array, and a peripheral circuit. The memory interface circuit receives at least a clock signal, a non-clock signal, and a setup-hold time control setting, and includes a programmable path delay circuit that is used to set a path delay of at least one of a clock path and a non-clock path according to the setup-hold time control setting. The clock path is used to deliver the clock signal, and the non-clock path is used to deliver the non-clock signal. The peripheral circuit is used to access the cell array according to at least the clock signal provided from the clock path and the non-clock signal.

10 Claims, 10 Drawing Sheets

EMBEDDED MEMORY WITH SETUP-HOLD TIME CONTROLLED INTERNALLY OR EXTERNALLY AND ASSOCIATED INTEGRATED CIRCUIT

CROSS REFERENCE TO RELATED APPLICATIONS

This application claims the benefit of U.S. provisional application No. 62/475,973, filed on Mar. 24, 2017 and incorporated herein by reference.

BACKGROUND

The present invention relates to an integrated circuit design, and more particularly, to an embedded memory with a setup-hold time that can be controlled internally or externally and an associated integrated circuit.

In general, a system-on-chip (SoC) uses lots of embedded memories. In the SoC design phase, the traditional timing sign-off may reserve a 3-sigma local variation factor for hold-time margin. However, a defective parts per million (DPPM) level covered by 3-sigma is obviously smaller than 1000 DPPM. If the reserved hold-time margin is increased from 3-sigma to 6-7 sigma, the DPPM can be improved. However, the DPPM is improved at the expense of chip area, timing closure and speed performance. As a result, the SoC design suffers from chip area, timing closure and speed performance, inevitably. Further, in a silicon debug phase, the memory built-in self-test (MBIST) logic of the embedded memory is unable to identify hold-time violations at the memory input interface and the MBIST logic itself. This may result in holes in the MBIST Shmoo plot.

SUMMARY

One of the objectives of the claimed invention is to provide an embedded memory with a setup-hold time that can be controlled internally/externally and an associated integrated circuit.

According to a first aspect of the present invention, an exemplary embedded memory in an integrated circuit is disclosed. The exemplary embedded memory includes a memory interface circuit, a cell array, and a peripheral circuit. The memory interface circuit includes a plurality of interface pins and a programmable path delay circuit. The interface pins are arranged to receive at least a clock signal, a non-clock signal, and a setup-hold time control setting. The programmable path delay circuit is arranged to set a path delay of at least one of a clock path and a non-clock path according to the setup-hold time control setting, wherein the clock path is arranged to deliver the clock signal, and the non-clock path is arranged to deliver the non-clock signal. The cell array has a plurality of memory cells. The peripheral circuit is arranged to access the cell array according to at least the clock signal provided from the clock path and the non-clock signal provided from the non-clock path.

According to a second aspect of the present invention, an exemplary integrated circuit is disclosed. The exemplary integrated circuit includes a clock tree, a flip-flop circuit, an embedded memory, and a clock-gating cell circuit. The clock tree is arranged to distribute at least a first clock signal and a second clock signal. The flip-flop circuit has a clock input port and a data output port, wherein the clock input port is arranged to receive the first clock signal from the clock tree via the clock-gating cell circuit, and the data output port is arranged to output a non-clock signal. The embedded memory is arranged to receive the second clock signal from the clock tree, receive the non-clock signal from the flip-flop circuit, and perform memory access according to at least the second clock signal and the non-clock signal. The clock-gating cell circuit is arranged to receive the first clock signal, and selectively provide the first clock signal to the clock input port of the flip-flop circuit. The clock-gating cell circuit comprises a programmable path delay circuit arranged to set a path delay of a clock path according to a setup-hold time control setting, wherein the clock path is arranged to deliver the first clock signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Embodiments of the present invention proposes an embedded memory with a setup-hold time that can be controlled internally or externally, thereby avoiding hold-time violations at the memory input interface. In this way, the "Shmoo hole" issue can be relaxed by the proposed solution. In addition, the SoC timing closure can also benefit from the proposed solution.

Figure 1:
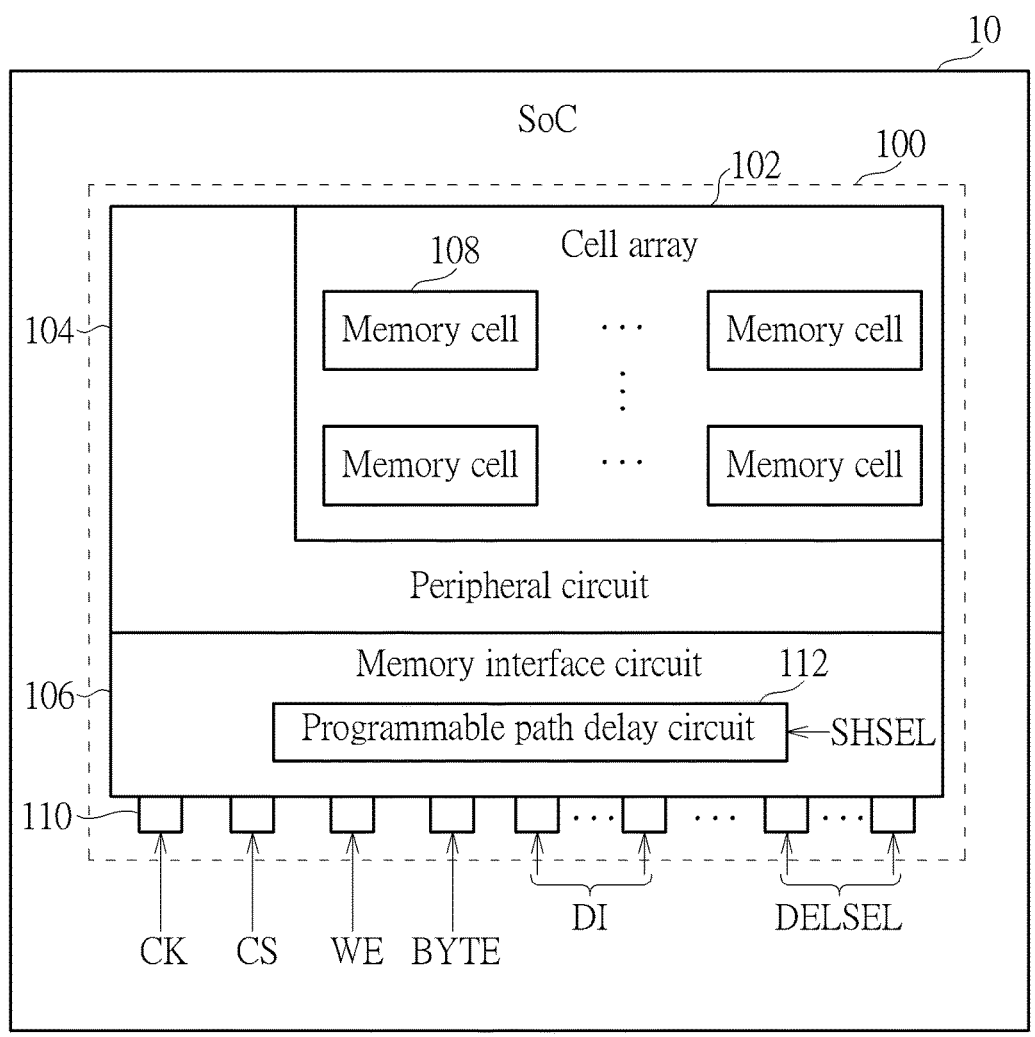
FIG. 1 is a diagram illustrating a first integrated circuit design according to an embodiment of the present invention.

FIG. 1 is a diagram illustrating a first integrated circuit design according to an embodiment of the present invention. In this embodiment, the integrated circuit is a system-on-chip (SoC) 10 having embedded memories included therein. For clarity and simplicity, only one embedded memory 100 is illustrated. The embedded memory 100 includes a cell array 102, a peripheral circuit 104, and a memory interface circuit 106. The cell array 102 has a plurality of memory cells 108. Each memory cell 108 can be assessed by enabling one word line and one bit line at which the memory cell 108 is located. The peripheral circuit 104 includes circuit elements needed to access (read/write) the cell array 102. For example, the peripheral circuit 104 may include a row decoder, row drivers, a clock generator, a timing controller, a column decoder, sense amplifiers, data latches, etc. In this embodiment, the memory interface circuit 106 includes a plurality of interface pins 110 and a programmable path delay circuit 112. The interface pins 110 are arranged to receive a clock signal, a plurality of non-clock signals, and a delay selection signal. Specifically, the interface pins 110 include one clock pin defined to receive a clock signal CK (which is an external clock generated from a clock source), one chip select (CS) pin defined to receive a CS signal (which is a non-clock signal), one write enable (WE) pin defined to receive a WE signal (which is a non-clock signal), one bit write enable (BYTE) pin defined to receive a BYTE signal (which is a non-clock signal), a plurality of address (ADR) pins defined to receive ADR bits (which are non-clock signals), a plurality of data input (DI) pins defined to receive DI bits (which are non-clock signals), and a plurality of delay select (DELSEL) pins defined to receive a delay selection signal composed of one or more DELSEL bits. It should be noted that a setup-hold time control setting SHSEL may be inputted by at least a portion (i.e., part or all) of the DELSEL bits, depending upon the actual design considerations. The peripheral circuit 104 reads/writes the cell array 102 according to at least the clock signal CK provided from a clock path and non-clock signal (s) provided from non-clock path(s). Since an embodiment of the present invention focuses on the memory interface design (particularly, the programmable path delay circuit 112), further description of cell array 102 and peripheral circuit 104 is omitted here for brevity.

It should be noted that only the circuit elements pertinent to the present invention are shown in FIG. 1. In practice, the embedded memory 100 may have additional circuit elements to achieve other designated functions.

The embedded memory 100 has a programmable input path delay controlled by the programmable path delay circuit 112. Hence, a programmable setup time and a programmable hold time of each non-clock signal received from an interface pin (e.g., a control pin, an address pin, or a data input pin) can be achieved at the memory interface circuit 106.

In accordance with one setup-hold time control scheme of the present invention, the programmable path delay circuit 112 is arranged to set a path delay of a clock path according to the setup-hold time control setting SHSEL, where the clock path is used to deliver the clock signal CK received by one interface pin 110.

Figure 2:
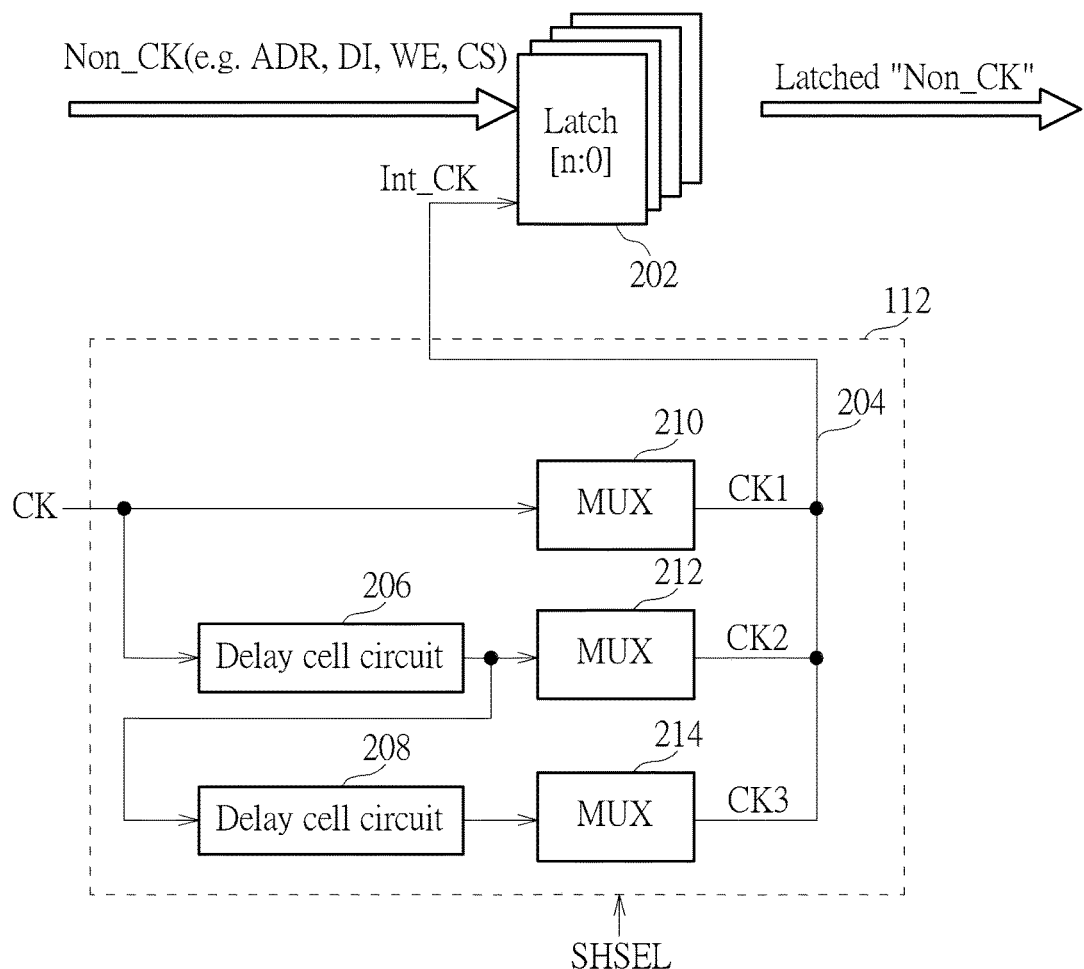
FIG. 2 is a diagram illustrating a first exemplary design of a programmable path delay circuit shown in FIG. 1 according to an embodiment of the present invention.

FIG. 2 is a diagram illustrating a first exemplary design of the programmable path delay circuit 112 shown in FIG. 1 according to an embodiment of the present invention. The programmable path delay circuit 112 includes a plurality of delay cell circuits 206, 208 and a plurality of multiplexers (MUXs) 210, 212, 214. It should be noted that the number of delay cell circuits shown in FIG. 2 and the number of multiplexers shown in FIG. 2 are for illustrative purposes only, and are not meant to be limitations of the present invention. In practice, the number of delay cell circuits and the number of multiplexers may be adjusted, depending upon actual design considerations.

The programmable path delay circuit 112 receives the clock signal CK from one interface pin 110, and delivers the clock signal CK to each latch 202 in the peripheral circuit 104 via the clock path 204, where each of the latches 202 (e.g., latch [0]-latch [n]) receives one non-clock signal Non_CK received from one interface pin 110 and an internal clock signal Int_CK provided from the programmable path delay circuit 112. By way of example, but not limitation, the non-clock signal Non_CK may be a CS signal, a WE signal, a BYTE signal, an ADR bit, a DI bit, or any synchronous input of the embedded memory 100.

Each of the delay cell circuits 206 and 208 is arranged to apply a predetermined delay amount to the clock signal CK. It should be noted that the delay cell circuits 206 and 208 may be implemented using the same delay cell design to offer the same predetermined delay amount, or may be implemented using different delay cell designs to offer different predetermined delay amounts. Consider a case where the delay cell circuits 206 and 208 may be implemented using the same delay cell design to offer the same predetermined delay amount DL. If the clock signal CK passes through one delay cell circuit, the clock signal CK is delayed by DL*1. If the clock signal CK passes through two delay cell circuits, the clock signal CK is delayed by DL*2.

The multiplexer 210 has an input port and an output port, wherein the input port is arranged to receive the clock signal CK without via any of the delay cell circuits 206 and 208, and the output port is arranged to selectively output the clock signal CK received at the input port according to the setup-hold time control setting SHSEL. The multiplexer 212 has an input port and an output port, wherein the input port is arranged to receive the clock signal CK via the delay cell circuit 206, and the output port is arranged to selectively output the clock signal CK received at the input port according to the setup-hold time control setting SHSEL. The multiplexer 214 has an input port and an output port, wherein the input port is arranged to receive the clock signal CK via the delay cell circuits 206 and 208, and the output port is arranged to selectively output the clock signal CK received at the input port according to the setup-hold time control setting SHSEL.

In this embodiment, the setup-hold time control setting SHSEL determines which one of the multiplexers 210, 212, 214 is enabled to output the received clock signal to the following latch 202. When the multiplexer 210 is enabled by the setup-hold time control setting SHSEL, a clock signal CK1 (which is generated by passing the clock signal CK through the multiplexer 210) is used to act as the internal clock signal Int_CK. When the multiplexer 212 is enabled by the setup-hold time control setting SHSEL, a clock signal CK2 (which is generated by passing the clock signal CK through the delay cell circuit 206 and the multiplexer 212) is used to act as the internal clock signal Int_CK. When the multiplexer 214 is enabled by the setup-hold time control setting SHSEL, a clock signal CK3 (which is generated by passing the clock signal CK through the delay cell circuits 206, 208 and the multiplexer 214) is used to act as the internal clock signal Int_CK. To put it simply, each of the clock signals CK1, CK2, CK3 may be regarded as the clock signal CK with a programmable clock skew. With a proper control of the programmable path delay circuit 112, the path delay of the clock path 204 can be adjusted, thereby affecting the setup time and the hold time of the non-clock signal Non_CK with respect to the internal clock signal Int_CK (which may be regarded as a clock signal CK with a programmable memory interface delay).

Figure 3:
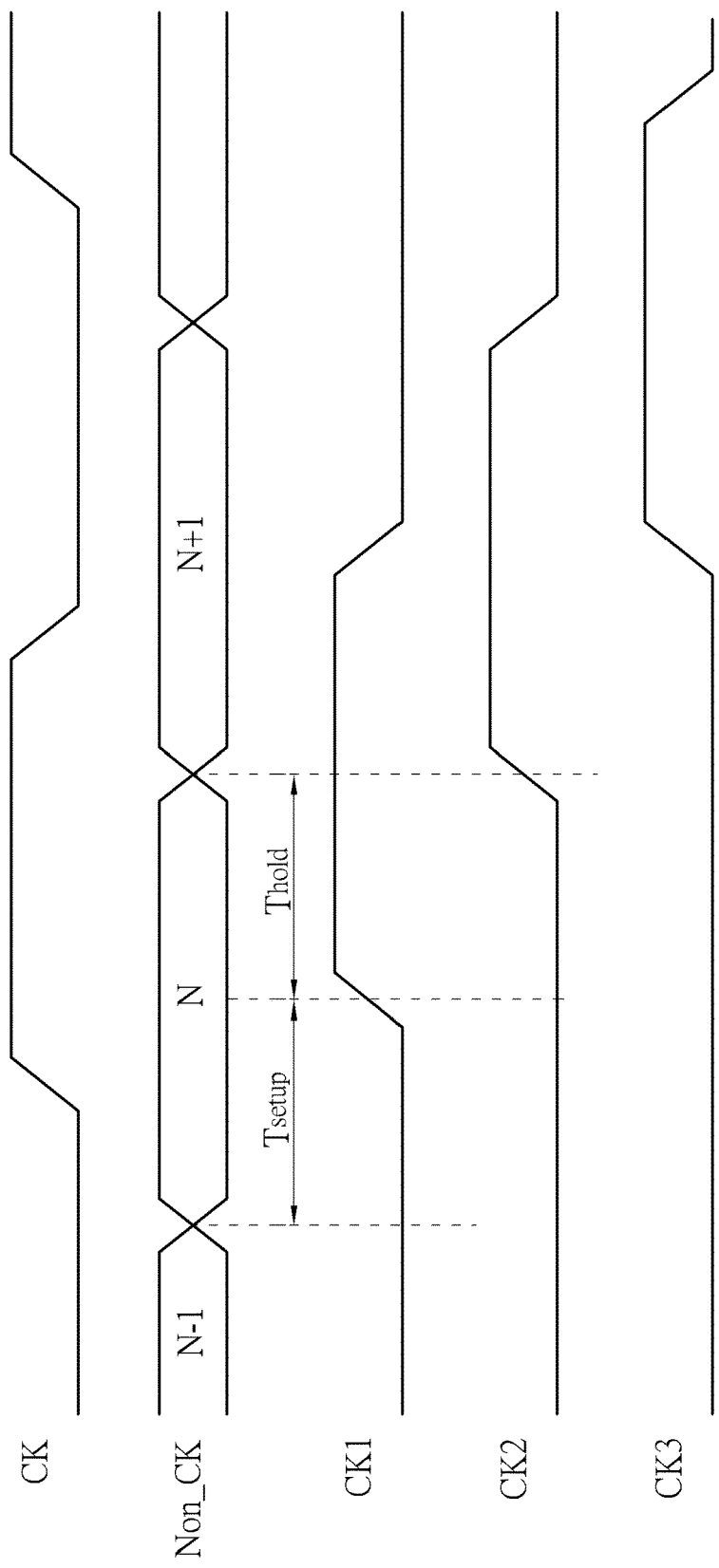
FIG. 3 is a diagram illustrating waveforms of a plurality of clock signals and a non-clock signal according to an embodiment of the present invention.

FIG. 3 is a diagram illustrating waveforms of clock signals CK, CK1, CK2, CK3 and non-clock signal Non_CK according to an embodiment of the present invention. The clock signals CK, CK1, CK2, CK3 have the same frequency but different phases. A phase delay between the clock signals CK1 and CK results from the multiplexer 210. A phase delay between the clock signals CK2 and CK results from the delay cell circuit 206 and the multiplexer 212. A phase delay between the clock signals CK3 and CK results from the delay cell circuits 206, 208 and the multiplexer 214. A setup time $T_{setup}$ is the amount of time the input signal should be held steady before a clock edge occurs. The hold time $T_{hold}$ is the amount of time the input signal should be held steady after the clock edge occurs. With a proper control of the programmable path delay circuit 112, the timing of the clock edge of the internal clock signal Int_CK can be adjusted to avoid the setup time violation and/or the hold time violation of the non-clock signal Non_CK at the latch 202. In this case shown in FIG. 3, the hold time passes the timing requirement when the internal clock signal Int_CK is set by the clock signal CK1; the hold time marginally passes the timing requirement when the internal clock signal Int_CK is set by the clock signal CK2; and the hold time fails to pass the timing requirement when the internal clock signal Int_CK is set by the clock signal CK2. Preferably, the setup-hold time control setting SHSEL maybe set to enable the multiplexer 210, thereby outputting the clock signal CK1 to the latch 202. It should be noted that the waveforms shown in FIG. 3 are for illustrative purposes only, and are not meant to be limitations of the present invention. In practice, one of the clock signals CK1, CK2, CK3 maybe selected on the basis of the actual timing relation between the clock signal CK and the non-clock signal Non_CK.

Figure 4:
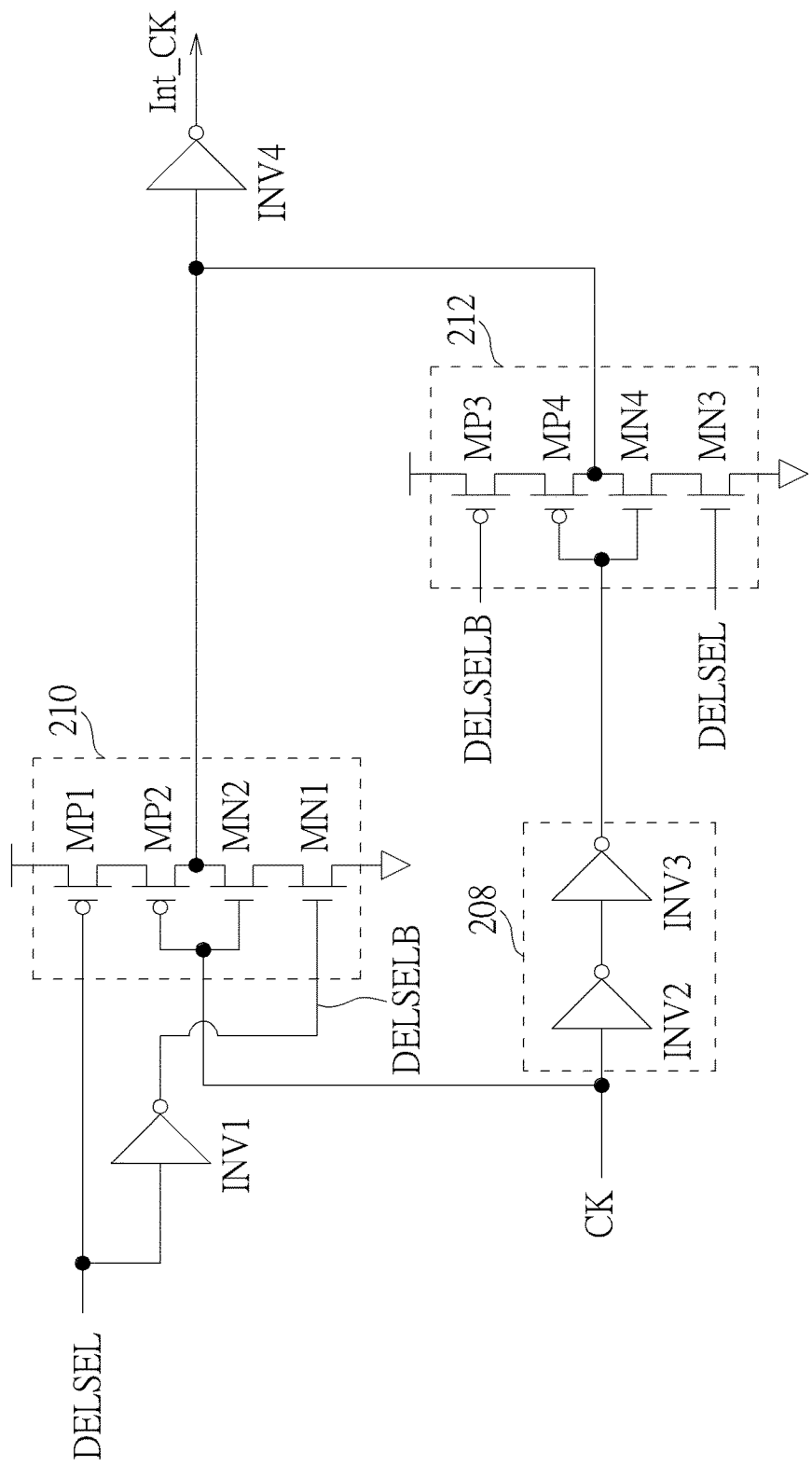
FIG. 4 is a diagram illustrating a circuit design of a programmable path delay circuit shown in FIG. 2 according to an embodiment of the present invention.

FIG. 4 is a diagram illustrating a circuit design of the programmable path delay circuit 112 shown in FIG. 2 according to an embodiment of the present invention. For clarity and simplicity, only two multiplexers 210, 212 and only one delay cell circuit 208 are shown in FIG. 4. The delay cell circuit 208 is implemented using two inverters INV2 and INV3. The multiplexer 210 is implemented using P-channel metal-oxide-semiconductor field effect transistors (PMOS transistors) MP1, MP2 and N-channel metal-oxide-semiconductor field effect transistors (NMOS transistors) MN1, MN2. The multiplexer 212 is implemented using PMOS transistors MP3, MP4 and NMOS transistors MN3, MN4. The setup-hold time control setting SHSEL includes one control bit DELSEL. The inverter INV1 sets another control bit DELSELB by inverting a logic level of the control bit DELSEL. In other words, when the control bit DELSEL has a high logic value "1", the control bit DELSELB has a low logic value "0"; and when the control bit DELSEL has a low logic value "0", the control bit DELSELB has a high logic value "1". When the control bit DELSEL is set by the low logic value "0", the multiplexer 210 is enabled, while the multiplexer 212 is disabled. Hence, the clock signal CK passes through the multiplexer 210, and is further processed by an inverter INV4 to become the internal clock Int_CK. When the control bit DELSEL is set by the high logic value "1", the multiplexer 210 is disabled, while the multiplexer 212 is enabled. Hence, the clock signal CK passes through the delay cell circuit 208 and the multiplexer 212, and is further processed by the inverter INV4 to become the internal clock signal Int_CK. It should be noted that the circuit implementation shown in FIG. 4 is for illustrative purposes only, and is not meant to be a limitation of the present invention. That is, the same objective of programming the path delay of the clock path 204 may be achieved by implementing the programmable path delay circuit 112 shown in FIG. 2 with another circuit design.

As can be seen from FIG. 4, the path delay of the clock path 204 is programmed by an integer number of gate delays. Hence, the granularity of programming the path delay of the clock path 204 depends on the gate delay. To improve the granularity of programming the path delay of the clock path 204, the present invention proposes another design of the programmable path delay circuit 112 shown in FIG. 1.

Figure 5:
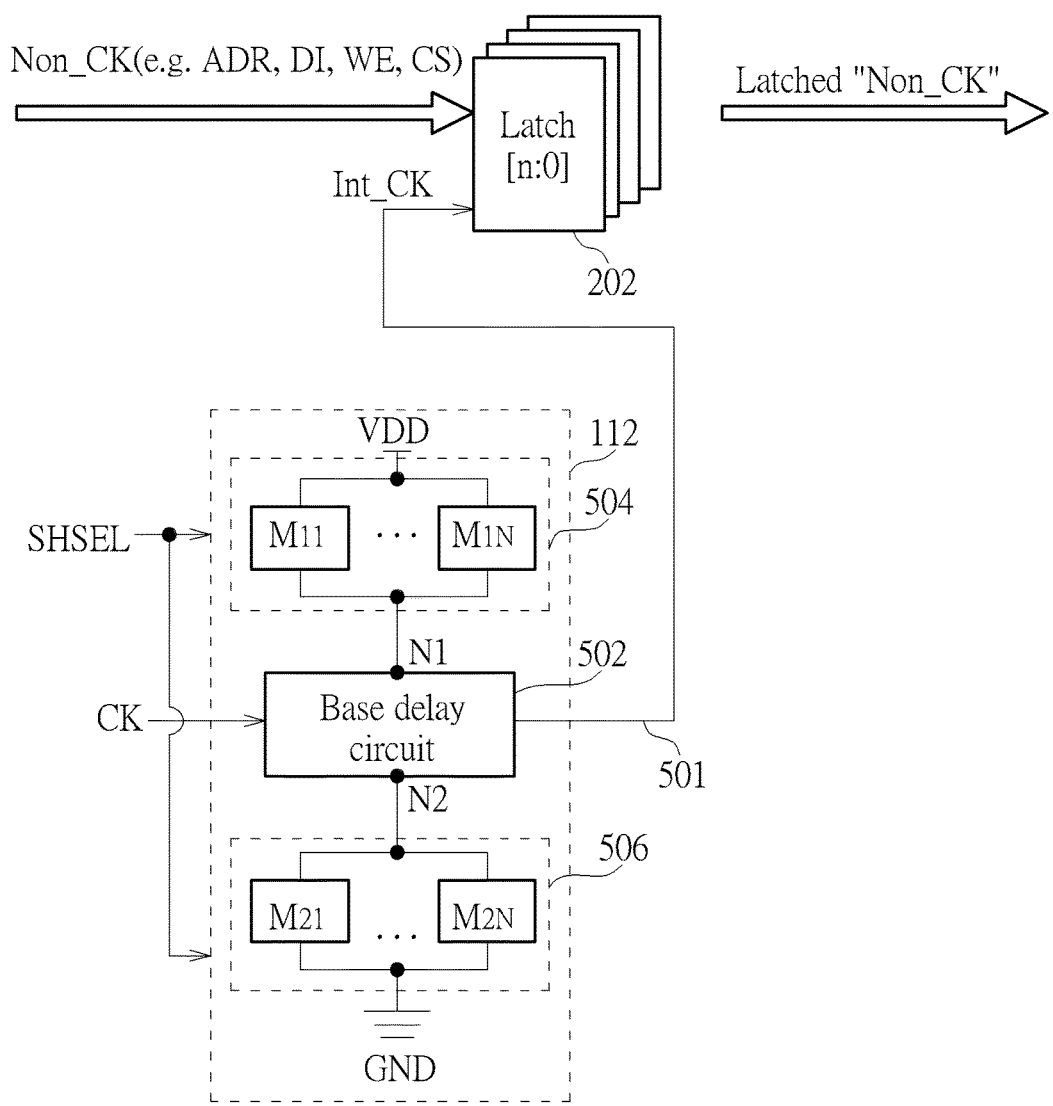
FIG. 5 is a diagram illustrating a second exemplary design of the programmable path delay circuit shown in FIG. 1 according to an embodiment of the present invention.

FIG. 5 is a diagram illustrating a second exemplary design of the programmable path delay circuit 112 shown in FIG. 1 according to an embodiment of the present invention. The programmable path delay circuit 112 includes a base delay circuit 502, a first delay control circuit 504, and a second delay control circuit 506. The programmable path delay circuit 112 receives the clock signal CK from one interface pin 110, and delivers the clock signal CK to each latch 202 in the peripheral circuit 104 via a clock path 501, where each of the latches 202 receives one non-clock signal Non_CK received from one interface pin 110 and an internal clock signal Int_CK provided from the programmable path delay circuit 112. By way of example, but not limitation, the non-clock signal Non_CK may be a CS signal, a WE signal, a BYTE signal, an ADR bit, a DI bit, or any synchronous input of the embedded memory 100.

The base delay circuit 502 is arranged to receive the clock signal CK, and apply a programmable delay amount to the clock signal CK. In other words, when the clock signal CK passes through the base delay circuit 502, the clock signal CK is delayed by the programmable delay amount. The first delay control circuit 504 includes a plurality of first transistors $M_{11}$-$M_{1N}$ connected in parallel between a first node N1 of the base delay circuit 502 and a supply voltage VDD. The second delay control circuit 506 includes a plurality of second transistors $M_{21}$-$M_{2N}$ connected in parallel between a second node N2 of the base delay circuit 502 and a ground voltage GND. The number of first transistors $M_{11}$-$M_{1N}$ implemented in the first delay control circuit 504 and the number of second transistors $M_{21}$-$M_{2N}$ implemented in the second delay control circuit 506 maybe adjusted, depending upon the actual design considerations. In this embodiment, the number of turned-on first transistors in the first delay control circuit 504 and the number of turned-on second transistors in the second delay control circuit 506 are both controlled by the setup-hold time control setting SHSEL.

The programmable delay amount of the base delay circuit 502 is determined by the number of turned-on first transistors in the first delay control circuit 504 and the number of turned-on second transistors in the second delay control circuit 506. For example, the programmable delay amount of the base delay circuit 502 is set by a first delay time when the number of turned-on first transistors in the first delay control circuit 504 is set by a first value and the number of turned-on second transistors in the second delay control circuit 506 is set by the same first value; and the programmable delay amount of the base delay circuit 502 is set by a second delay time when the number of turned-on first transistors in the first delay control circuit 504 is set by a second value and the number of turned-on second transistors in the second delay control circuit 506 is set by the same second value. In this embodiment, if the first value is larger than the second value, the first delay time is shorter than the second delay time due to a larger driving current used by the base delay circuit 502; and if the first value is smaller than the second value, the first delay time is longer than the second delay time due to a smaller driving current used by the base delay circuit 502. With a proper control of the programmable path delay circuit 112, the timing of the clock edge of the internal clock signal Int_CK can be adjusted to avoid the setup time violation and/or the hold time violation of the non-clock signal Non_CK at the latch 202.

The programmable path delay circuit 112 shown in FIG. 5 controls the path delay of the clock path 501 through tuning the magnitude of the driving current used by the base delay circuit 502. Compared to the programmable path delay circuit 112 shown in FIG. 2, the programmable path delay circuit 112 shown in FIG. 5 is capable of controlling the path delay with finer granularity.

Figure 6:
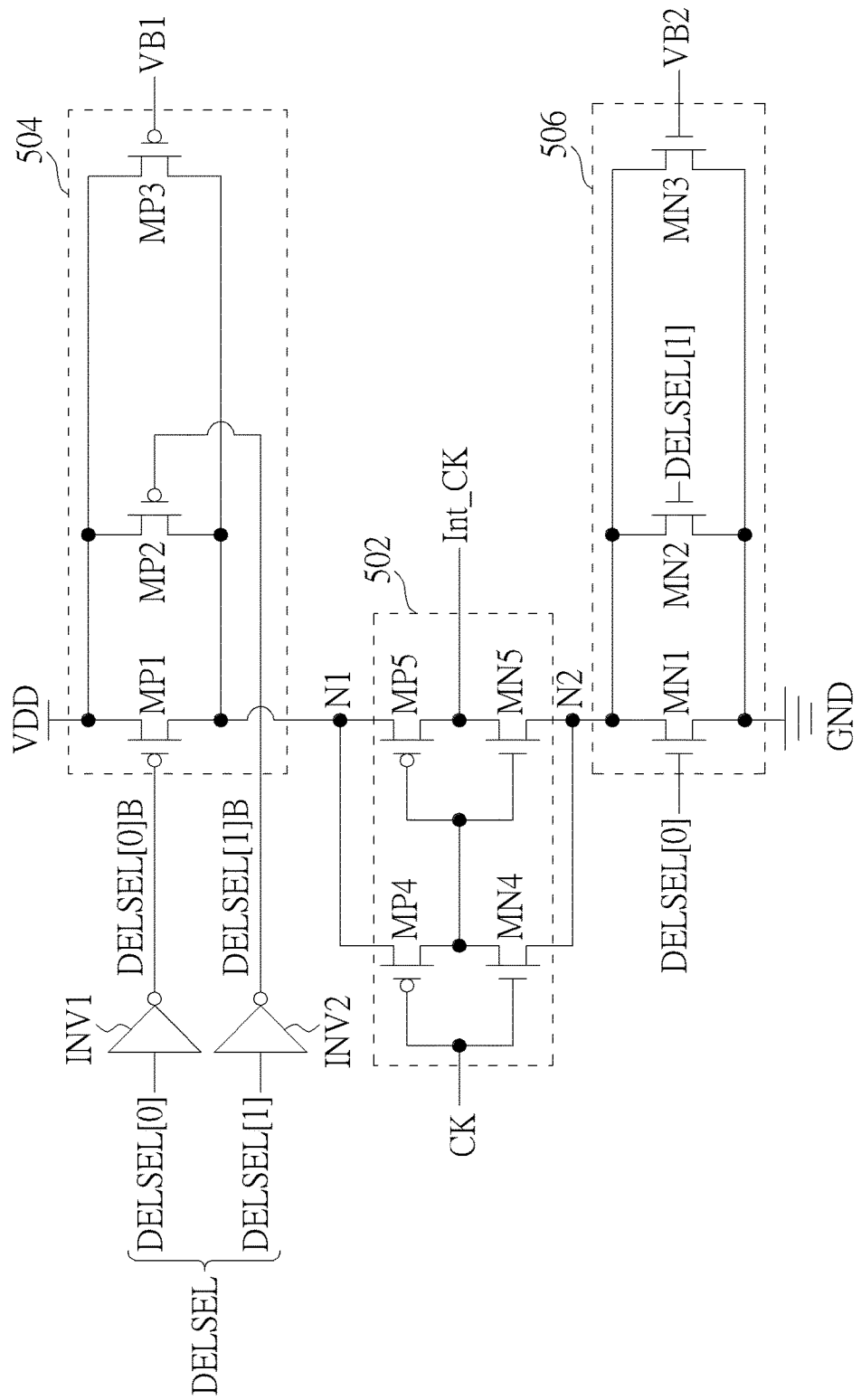
FIG. 6 is a diagram illustrating a circuit design of a programmable path delay circuit shown in FIG. 5 according to an embodiment of the present invention.

FIG. 6 is a diagram illustrating a circuit design of the programmable path delay circuit 112 shown in FIG. 5 according to an embodiment of the present invention. The first delay control circuit 504 is implemented using PMOS transistors MP1, MP2, MP3. The second delay control circuit 506 is implemented using NMOS transistors MN1, MN2, MN3. For clarity and simplicity, each of the first delay control circuit 504 and the second delay control circuit 506 is shown having three transistors only. The base delay circuit 502 is implemented using PMOS transistors MP4, MP5 and NMOS transistors MN4, MN5, where PMOS transistor MP4 and NMOS transistor MN4 form one inverter, and PMOS transistor MP5 and NMOS transistor MN5 form another inverter.

The setup-hold time control setting SHSEL includes one control input DELSEL composed of two control bits DELSEL[0] and DELSEL[1]. The inverter INV1 sets another control bit DELSEL[0]B by inverting a logic level of the control bit DELSEL[0]. The inverter INV2 sets yet another control bit DELSEL[1]B by inverting a logic level of the control bit DELSEL[1]. In other words, when the control bit DELSEL[0] has a high logic value "1", the control bit DELSEL[0]B has a low logic value "0"; and when the control bit DELSEL[0] has a low logic value "0", the control bit DELSEL[0]B has a high logic value "1". Similarly, when the control bit DELSEL[1] has a high logic value "1", the control bit DELSEL[1]B has a low logic value "0"; and when the control bit DELSEL[1] has a low logic value "0", the control bit DELSEL[1]B has a high logic value "1". It should be noted that the PMOS transistor MP3 is turned on by a first bias voltage VB1 (e.g., ground voltage GND), and the NMOS transistor NP3 is turned on by a second bias voltage VB2 (e.g., supply voltage VDD). Thus, the PMOS transistor MP3 is turned on regardless of on/off statuses of PMOS transistors MP1 and MP2, and the NMOS transistor MN3 is turned on regardless of on/off statuses of NMOS transistors MN1 and MN2.

When the control bit DELSEL[0] is set by the low logic value "0", the PMOS transistor MP1 is turned off, and the NMOS transistor MN1 is turned off. When the control bit DELSEL[0] is set by the high logic value "1", the PMOS transistor MP1 is turned on, and the NMOS transistor MN1 is turned on. When the control bit DELSEL[1] is set by the low logic value "0", the PMOS transistor MP2 is turned off, and the NMOS transistor MN2 is turned off. When the control bit DELSEL[1] is set by the high logic value "1", the PMOS transistor MP2 is turned on, and the NMOS transistor MN2 is turned on.

When the control bits DELSEL[0] and DELSEL[1] are both set by the low logic value "0", the first delay control circuit 504 has only one turned-on PMOS transistor MP3, and the second delay control circuit 506 has only one turned-on NMOS transistor MN3. Hence, the path delay of the clock path 204 is programmed to have a largest delay amount due to a smallest driving current.

When only one of the control bit DELSEL[0] and DELSEL[1] is set by the high logic value "1", the first delay control circuit 504 has two turned-on PMOS transistors (e.g., MP1 and MP3, or MP2 and MP3), and the second delay control circuit 506 has two turned-on NMOS transistors (e.g., MN1 and MN3, or MN2 and MN3). Hence, the path delay of the clock path 204 is programmed to have a medium delay amount due to a medium driving current.

When the control bit DELSEL[0] and DELSEL[1] are both set by the high logic value "1", the first delay control circuit 504 has three turned-on PMOS transistors MP1, MP2, MP3, and the second delay control circuit 506 has three turned-on NMOS transistors MN1, MN2, MN3. Hence, the path delay of the clock path 204 is programmed to have a smallest delay amount due to a largest driving current.

It should be noted that the circuit implementation shown in FIG. 6 is for illustrative purposes only, and is not meant to be a limitation of the present invention. That is, the same objective of programming the path delay of the clock path 501 may be achieved by implementing the programmable path delay circuit 112 shown in FIG. 5 with another circuit design.

As can be known from FIG. 3, whether any of the setup time $T_{setup}$ and the hold time $T_{hold}$ violates the timing requirement depends on the relative timing relation between a clock signal and a non-clock signal (which is to be sampled by the clock signal). Adjusting the timing of the clock signal is able to affect the setup time $T_{setup}$ and the hold time $T_{hold}$. Alternatively, adjusting the timing of the non-clock signal is also able to affect the setup time $T_{setup}$ and the hold time $T_{hold}$. In accordance with another setup-hold time control scheme of the present invention, the programmable path delay circuit 112 is arranged to set a path delay of a non-clock path according to the setup-hold time control setting SHSEL, where the non-clock path is used to deliver a non-clock signal (e.g., a CS signal, a WE signal, a BYTE signal, an ADR bit, a DI bit, or any synchronous input) received by one interface pin 110 of the embedded memory 100.

Figure 7:
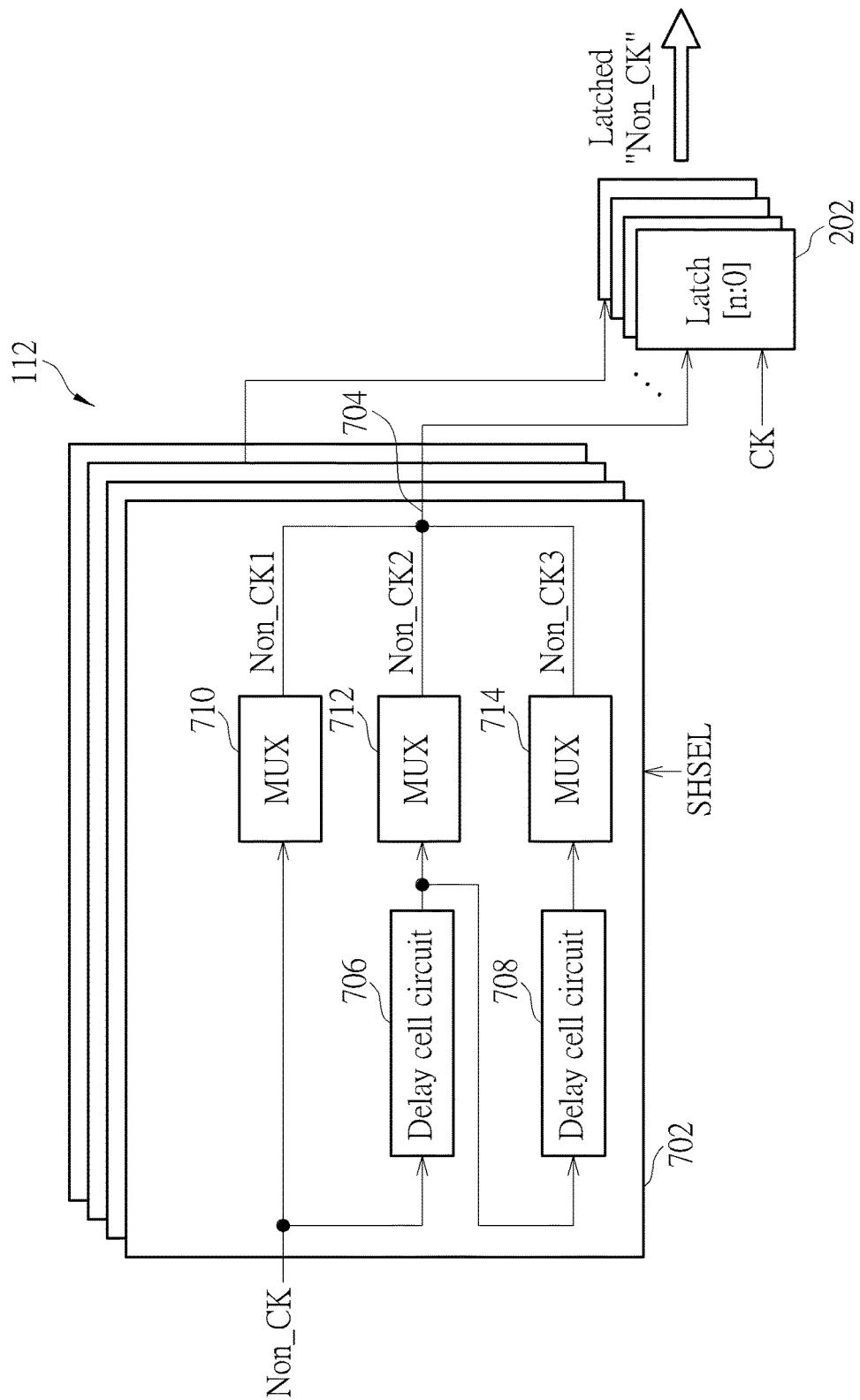
FIG. 7 is a diagram illustrating a third exemplary design of the programmable path delay circuit shown in FIG. 1 according to an embodiment of the present invention.

FIG. 7 is a diagram illustrating a third exemplary design of the programmable path delay circuit 112 shown in FIG. 1 according to an embodiment of the present invention. The programmable path delay circuit 112 may include a plurality of circuit modules 702, each arranged to provide one non-clock signal Non_CK to one of a plurality of latches 202 in the peripheral circuit 104. Each circuit module 702 in the programmable path delay circuit 112 includes a plurality of delay cell circuits 706, 708 and a plurality of multiplexers (MUXs) 710, 712, 714. It should be noted that the number of delay cell circuits shown in FIG. 7 and the number of multiplexers shown in FIG. 7 are for illustrative purposes only, and are not meant to be limitations of the present invention. In practice, the number of delay cell circuits and the number of multiplexers implemented in each circuit module 702 may be adjusted, depending upon the actual design considerations.

Each circuit module 702 of the programmable path delay circuit 112 receives the non-clock signal Non_CK (e.g., a CS signal, a WE signal, a BYTE signal, an ADR bit, a DI bit, or any synchronous input of the embedded memory 100) from one interface pin 110, and delivers the non-clock signal Non_CK to one latch 202 via a non-clock path 704, where each latch 202 receives the clock signal CK received from one interface pin 110 and one non-clock signal Non_CK provided from the programmable path delay circuit 112.

Each of the delay cell circuits 706 and 708 is arranged to apply a predetermined delay amount to the non-clock signal Non_CK. It should be noted that the delay cell circuits 706 and 708 may be implemented using the same delay cell design to offer the same predetermined delay amount, or may be implemented using different delay cell designs to offer different predetermined delay amounts. Consider a case where the delay cell circuits 706 and 708 may be implemented using the same delay cell design to offer the same predetermined delay amount DL. If the non-clock signal Non_CK passes through one delay cell circuit, the non-clock signal Non_CK is delayed by DL*1. If the non-clock signal Non_CK passes through two delay cell circuits, the non-clock signal Non_CK is delayed by DL*2.

The multiplexer 710 has an input port and an output port, wherein the input port is arranged to receive the non-clock signal Non_CK without via any of the delay cell circuits 706 and 708, and the output port is arranged to selectively output the non-clock signal Non_CK received at the input port according to the setup-hold time control setting SHSEL. The multiplexer 712 has an input port and an output port, wherein the input port is arranged to receive the non-clock signal Non_CK via the delay cell circuit 706, and the output port is arranged to selectively output the non-clock signal Non_CK received at the input port according to the setup-hold time control setting SHSEL. The multiplexer 714 has an input port and an output port, wherein the input port is arranged to receive the non-clock signal Non_CK via the delay cell circuits 706 and 708, and the output port is arranged to selectively output the non-clock signal Non_CK received at the input port according to the setup-hold time control setting SHSEL.

In this embodiment, the setup-hold time control setting SHSEL determines which one of the multiplexers 710, 712, 714 is enabled to output the received non-clock signal to the following latch 202. When the multiplexer 710 is enabled by the setup-hold time control setting SHSEL, a non-clock signal Non_CK1 (which is generated by passing the non-clock signal Non_CK through the multiplexer 710) is used to act as the non-clock input of the latch 202. When the multiplexer 712 is enabled by the setup-hold time control setting SHSEL, a non-clock signal Non_CK2 (which is generated by passing the non-clock signal Non_CK through the delay cell circuit 706 and the multiplexer 712) is used to act as the non-clock input of the latch 202. When the multiplexer 714 is enabled by the setup-hold time control setting SHSEL, a non-clock signal Non_CK3 (which is generated by passing the non-clock signal Non_CK through the delay cell circuits 706, 708 and the multiplexer 714) is used to act as the non-clock input of the latch 202. With a proper control of the programmable path delay circuit 112, the path delay of the non-clock path 704 can be adjusted, thereby affecting the setup time and the hold time of the non-clock input (which may be regarded as a non-clock signal Non_CK with a programmable memory interface delay) with respect to the clock signal CK.

Figure 8:
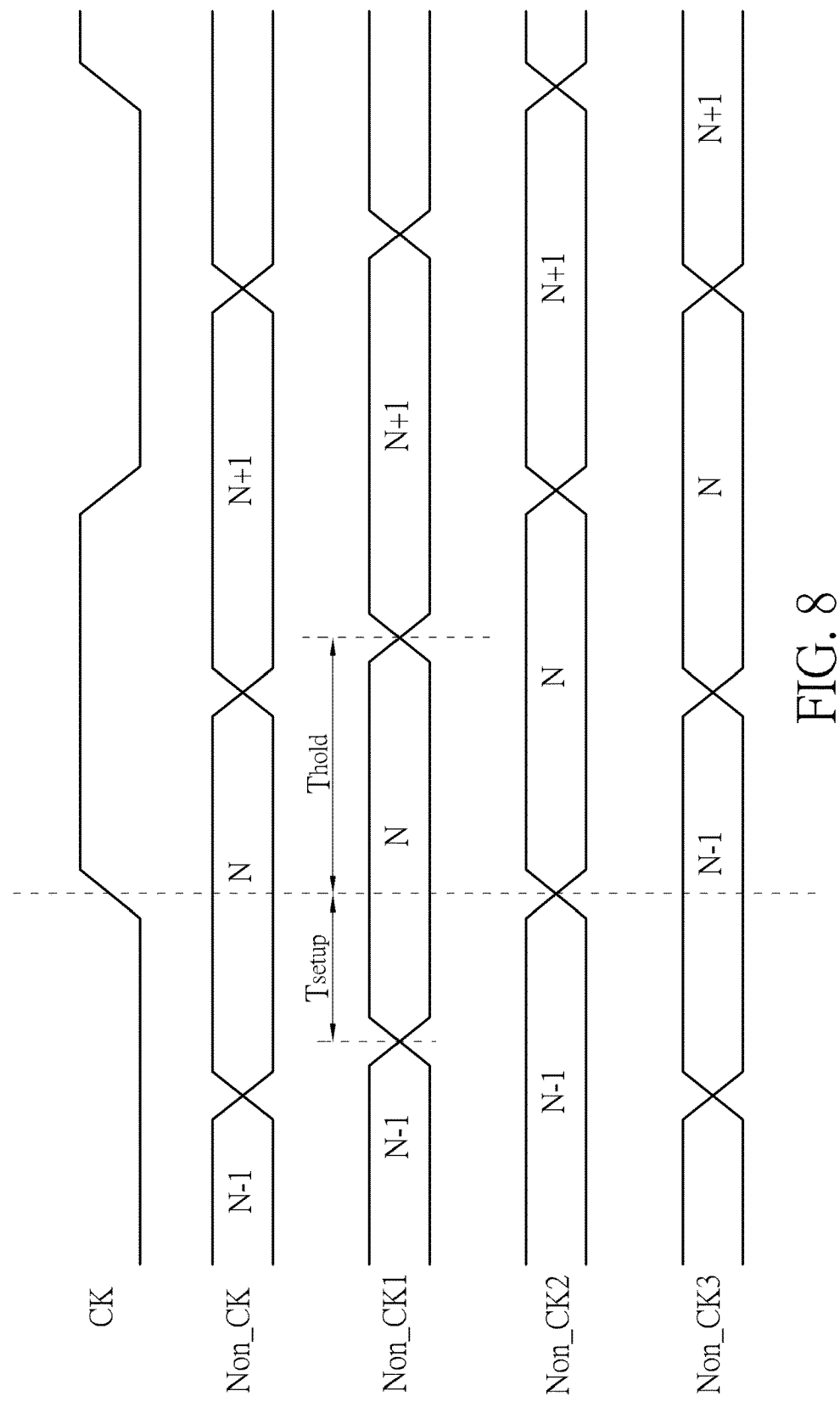
FIG. 8 is a diagram illustrating waveforms of a plurality of non-clock signals and a clock signal according to an embodiment of the present invention.

FIG. 8 is a diagram illustrating waveforms of non-clock signals Non_CK, Non_CK1, Non_CK2, Non_CK3 and clock signal CK according to an embodiment of the present invention. The non-clock signals Non_CK, Non_CK1, Non_CK2, Non_CK3 have the same waveform but different timing. A timing delay between the non-clock signals Non_CK1 and Non_CK results from the multiplexer 710. A timing delay between the non-clock signals Non_CK2 and Non_CK results from the delay cell circuit 706 and the multiplexer 712. A timing delay between the non-clock signals Non_CK3 and Non_CK results from the delay cell circuits 706, 708 and the multiplexer 714. With a proper control of the programmable path delay circuit 112, the timing of the non-clock input can be adjusted to avoid the setup time violation and/or the hold time violation of the non-clock signal Non_CK at the latch 202. In this case shown in FIG. 8, the setup time passes the timing requirement when the non-clock input is set by the non-clock signal Non_CK1; the setup time marginally passes the timing requirement when the non-clock input is set by the non-clock signal Non_CK2; and the setup time fails to pass the timing requirement when the non-clock input is set by the non-clock signal Non_CK3. Preferably, the setup-hold time control setting SHSEL may be set to enable the multiplexer 710, thereby outputting the non-clock signal Non_CK1 to the latch 202. It should be noted that the waveforms shown in FIG. 8 are for illustrative purposes only, and are not meant to be limitations of the present invention. In practice, one of the non-clock signals Non_CK1, Non_CK2, Non_CK3 may be selected on the basis of the actual timing relation between the clock signal CK and the non-clock signal Non_CK.

The function of each circuit module 702 in the programmable path delay circuit 112 shown in FIG. 7 is similar to that of the programmable path delay circuit 112 shown in FIG. 2. The major difference is that an input of each circuit module 702 in the programmable path delay circuit 112 shown in FIG. 7 is a non-clock signal Non_CK (e.g., a CS signal, a WE signal, a BYTE signal, an ADR bit, a DI bit, or any synchronous input). Hence, each circuit module 702 in the programmable path delay circuit 112 may also be implemented using the circuit design shown in FIG. 4. Further description is omitted here for brevity.

Figure 9:
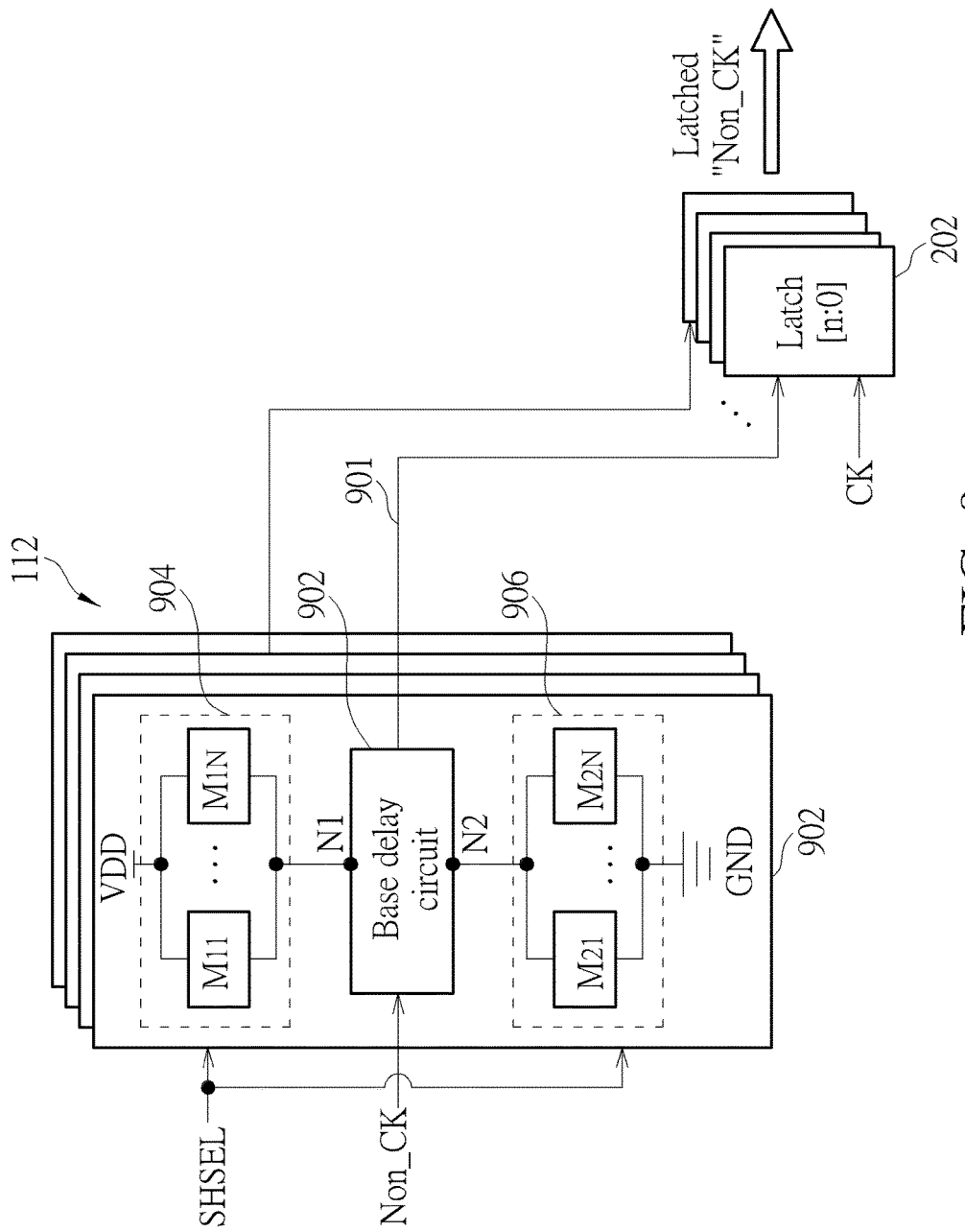
FIG. 9 is a diagram illustrating a fourth exemplary design of the programmable path delay circuit shown in FIG. 1 according to an embodiment of the present invention.

FIG. 9 is a diagram illustrating a fourth exemplary design of the programmable path delay circuit 112 shown in FIG. 1 according to an embodiment of the present invention. The programmable path delay circuit 112 may include a plurality of circuit modules 902, each arranged to receive a non-clock signal Non_CK from one interface pin 110 and deliver the non-clock signal Non_CK to one latch 202 in the peripheral circuit 104 via a non-clock path 901. Each circuit module 902 in the programmable path delay circuit 112 includes a base delay circuit 902, a first delay control circuit 904, and a second delay control circuit 906. Each latch 202 receives the clock signal CK from one interface pin 110 and one non-clock signal Non_CK provided from the programmable path delay circuit 112. By way of example, but not limitation, the non-clock signal Non_CK may be a CS signal, a WE signal, a BYTE signal, an ADR bit, a DI bit, or any synchronous input of the embedded memory 100.

The base delay circuit 902 is arranged to receive the non-clock signal Non_CK, and apply a programmable delay amount to the non-clock signal Non_CK. In other words, when the non-clock signal Non_CK passes through the base delay circuit 902, the non-clock signal Non_CK is delayed by the programmable delay amount. The first delay control circuit 904 includes a plurality of first transistors $M_{11}$-$M_{1N}$ connected in parallel between a first node N1 of the base delay circuit 902 and a supply voltage VDD. The second delay control circuit 906 includes a plurality of second transistors $M_{21}$-$M_{2N}$ connected in parallel between a second node N2 of the base delay circuit 902 and a ground voltage GND. The number of first transistors $M_{11}$-$M_{1N}$ implemented in the first delay control circuit 904 and the number of second transistors $M_{21}$-$M_{2N}$ implemented in the second delay control circuit 906 may be adjusted, depending upon the actual design considerations. In this embodiment, the number of turned-on first transistors in the first delay control circuit 904 and the number of turned-on second transistors in the second delay control circuit 906 are both controlled by the setup-hold time control setting SHSEL.

The programmable delay amount of the base delay circuit 902 is determined by the number of turned-on first transistors in the first delay control circuit 904 and the number of turned-on second transistors in the second delay control circuit 906. For example, the programmable delay amount of the base delay circuit 902 is set by a first delay time when the number of turned-on first transistors in the first delay control circuit 904 is set by a first value and the number of turned-on second transistors in the second delay control circuit 906 is set by the same first value; and the programmable delay amount of the base delay circuit 902 is set by a second delay time when the number of turned-on first transistors in the first delay control circuit 904 is set by a second value and the number of turned-on second transistors in the second delay control circuit 906 is set by the same second value. In this embodiment, if the first value is larger than the second value, the first delay time is shorter than the second delay time due to a larger driving current used by the base delay circuit 902; and if the first value is smaller than the second value, the first delay time is longer than the second delay time due to a smaller driving current used by the base delay circuit 902. With a proper control of the programmable path delay circuit 112, the timing of the non-clock input can be adjusted to avoid the setup time violation and/or the hold time violation of the non-clock input at the latch 202.

The programmable path delay circuit 112 shown in FIG. 9 controls the path delay of the clock path 901 through tuning the magnitude of the driving current used by the base delay circuit 902. Compared to the programmable path delay circuit 112 shown in FIG. 7, the programmable path delay circuit 112 shown in FIG. 9 is capable of controlling the path delay with finer granularity.

The function of each circuit module 902 in the programmable path delay circuit 112 shown in FIG. 9 is similar to that of the programmable path delay circuit 112 shown in FIG. 5. The major difference is that an input of each circuit module 902 in the programmable path delay circuit 112 shown in FIG. 9 is a non-clock signal Non_CK (e.g., a CS signal, a WE signal, a BYTE signal, an ADR bit, a DI bit, or any synchronous input). Hence, each circuit module 902 in the programmable path delay circuit 112 may also be implemented using the circuit design shown in FIG. 6. Further description is omitted here for brevity.

In above embodiments, the programmable path delay circuit 112 is used to set a path delay of only one of a clock path and a non-clock path according to the setup-hold time control setting. Alternatively, the programmable path delay circuit 112 may be modified to set path delays of both of a clock path and a non-clock path according to the setup-hold time control setting. This alternative design also falls within the scope of the present invention.

Adjusting the timing of the non-clock signal is also able to affect the setup time $T_{setup}$ and the hold time $T_{hold}$. In above embodiments, the embedded memory 100 has the memory interface circuit 106 equipped with the programmable path delay circuit 112 for achieving the objective of adjusting the timing of the non-clock signal at the memory interface. In other words, the above embodiments propose an embedded memory with a setup-hold time controlled internally. However, the same objective of adjusting the timing of a non-clock signal may be achieved by adjusting the timing of a clock signal at a circuit element (e.g., a flip flop) that is external to an embedded memory and is used to provide the non-clock signal to the embedded memory. Hence, an embodiment of the present invention further proposes an embedded memory with a setup-hold time controlled externally.

Figure 10:
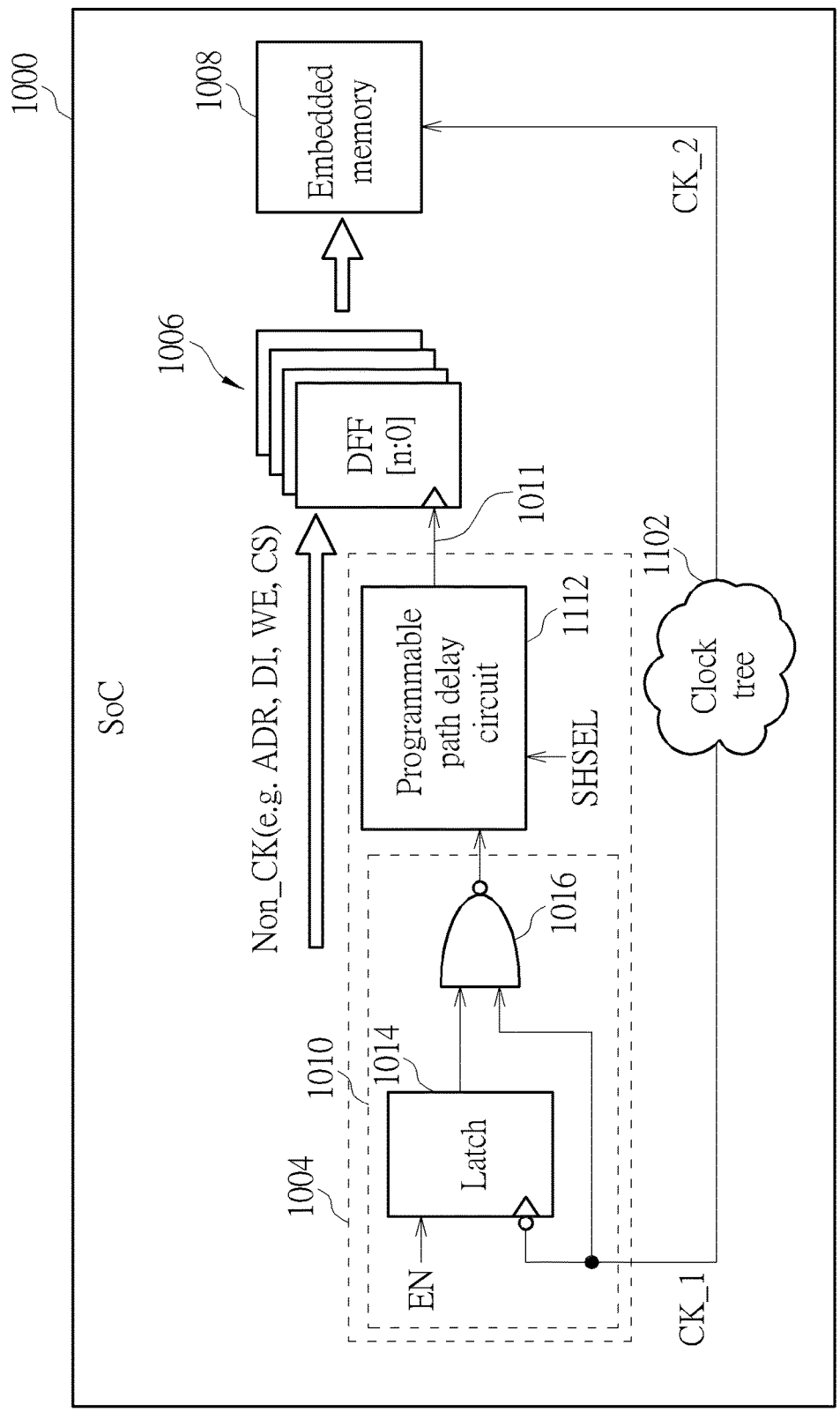
FIG. 10 is a diagram illustrating a second integrated circuit design according to an embodiment of the present invention.

FIG. 10 is a diagram illustrating a second integrated circuit design according to an embodiment of the present invention. In this embodiment, the integrated circuit is a system-on-chip (SoC) 1000 having embedded memories included therein. For clarity and simplicity, only one embedded memory 1008 is illustrated. In addition to the embedded memory 1008, the SoC 1000 includes a clock tree 1002, a clock-gating cell circuit 1004, and one or more flip-flop circuits 1006. It should be noted that only the circuit elements pertinent to the present invention are shown in FIG. 10. In practice, the SoC 1000 may have additional circuit elements to achieve other designated functions.

The clock tree 1002 is arranged to distribute a plurality of clock signals to a plurality of clock-driven circuit elements in the SoC 1000, respectively. For example, the clock tree 1002 may distribute a first clock signal CK_1 and a second clock signal CK_2 having the same frequency but different clock skews. Each flip-flop circuit 1006 may be a D-type flip flop (DFF) having a clock input port, a data input port and a data output port, where the clock input port is arranged to receive the first clock signal CK_1 from the clock tree 1002 via the clock-gating cell circuit 1004, the data input port is arranged to receive one non-clock signal Non_CK (e.g., a CS signal, a WE signal, a BYTE signal, an ADR bit, a DI bit, or any synchronous input), and the data output port is arranged to output the sampled non-clock signal Non_CK to the embedded memory 1008. The embedded memory 1008 has one interface pin arranged to receive the non-clock signal output from each flip-flop circuit 1006, and further has one interface pin arranged to receive the second clock signal CK_2 from the clock tree 1002. Specifically, the embedded memory 1008 performs memory access according to at least the second clock signal CK_2 received from the clock tree 1002 and the non-clock signal (s) Non_CK received from flip-flop circuit(s) 1006.

The clock-gating cell circuit 1004 is arranged to receive the first clock signal CK_1 from the clock tree 1002, and selectively provide the first clock signal CK_1 to the clock input port of each flip-flop circuit 1006. As shown in FIG. 10, the clock-gating cell circuit 1004 includes a clock-gating circuit 1010 and a programmable path delay circuit 1012. In this embodiment, the clock-gating circuit 1010 is a clock-gating cell implemented using a latch 1014 and a NAND gate 1016. The latch 1014 is controlled by the first clock signal CK_1 to output a clock-gating enable signal EN to one input port of the NAND gate 1016. When the clock-gating enable signal EN is set by a logic low level, the clock-gating function is enabled to gate the first clock signal CK_1, such that a constant voltage level is output from the clock-gating circuit 1010. When the clock-gating enable signal EN is set by a logic high level, the clock-gating function is disabled, thus allowing the first clock signal CK_1 to be output from the clock-gating circuit 1010.

In some embodiments of the present invention, the NAND gate 1016 may be replaced with an AND gate, an OR gate or a NOR gate to meet the design requirements. Further, the clock-gating circuit 1010 may be modified to include additional logic gates (e.g., inverters) to meet the design requirements To put it simply, the circuit design of the clock-gating circuit 1010 shown in FIG. 10 is for illustrative purposes only. The clock-gating circuit 1010 may be implemented using any available clock-gating design. Since the present invention does not focus on the circuit design of the clock-gating circuit 1010, further description is omitted here for brevity.

When the clock-gating function is disabled by the clock-gating enable signal EN, the programmable path delay circuit 1012 receives the first clock signal CK_1 from the preceding clock-gating circuit 1010, and delivers the first clock signal CK_1 to each flip-flop circuit 1006 via a clock path 1011. The programmable path delay circuit 1012 is arranged to set a path delay of the clock path 1011 according to a setup-hold time control setting SHSEL. For example, the programmable path delay circuit 1012 may be implemented using the programmable path delay circuit 112 shown in FIG. 2 with the first clock signal CK_1 shown in FIG. 10 as its clock input, or may be implemented using the programmable path delay circuit 112 shown in FIG. 4 with the first clock signal CK_1 shown in FIG. 10 as its clock input. Since a person skilled in the art can readily understand details of the programmable path delay circuit 1012 after reading above paragraphs directed to the programmable path delay circuit 112 shown in FIG. 2 and FIG. 4, further description is omitted here for brevity.

As mentioned above, each flip-flop circuit 1006 may be a D-type flip flop (DFF) having a clock input port, a data input port, and a data output port, where the clock input port is arranged to receive the first clock signal CK_1 via the clock-gating cell circuit 1004, the data input port is arranged to receive one non-clock signal Non_CK (e.g., a CS signal, a WE signal, a BYTE signal, an ADR bit, a DI bit, or any synchronous input), and the data output port is arranged to output the sampled non-clock signal Non_CK to the embedded memory 1008. With a proper setting of the setup-hold time control setting SHSEL, the timing of the first clock signal CK_1 fed into each flip-flop circuit 1006 is adjusted, thus affecting the timing of the non-clock signal Non_CK fed into the embedded memory 1008. Hence, the setup time and the hold time of the non-clock signal Non_CK received by the embedded memory 1008 (which further receives the second clock signal CK_2) can be indirectly programmed by the programmable path delay circuit 1012 of the clock-gating circuit 1004 external to the embedded memory 1008.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An embedded memory in an integrated circuit comprising:
    a memory interface circuit, comprising:
        a plurality of interface pins, arranged to receive at least a clock signal, a non-clock signal, and a setup-hold time control setting; and
        a programmable path delay circuit, arranged to set a path delay of at least one of a clock path and a non-clock path according to the setup-hold time control setting, wherein the clock path is arranged to deliver the clock signal, and the non-clock path is arranged to deliver the non-clock signal;
    a cell array, comprising a plurality of memory cells; and
    a peripheral circuit, arranged to access the cell array according to at least the clock signal provided from the clock path circuit and the non-clock signal provided from the non-clock path.

2. The embedded memory of claim 1, wherein the programmable path delay circuit is arranged to control the path delay of the clock path according to the setup-hold time control setting.

3. The embedded memory of claim 2, wherein the programmable path delay circuit comprises:
    a delay cell circuit, arranged to apply a predetermined delay amount to the clock signal;
    a first multiplexer, having a first input port and a first output port, wherein the first input port is arranged to receive the clock signal without via the delay cell circuit, and the first output port is arranged to selectively output the clock signal received at the first input port according to the setup-hold time control setting; and
    a second multiplexer, having a second input port and a second output port, wherein the second input port is arranged to receive the clock signal via the delay cell circuit, and the second output port is arranged to selectively output the clock signal received at the second input port according to the setup-hold time control setting.

4. The embedded memory of claim 2, wherein the programmable path delay circuit comprises:
    a base delay circuit, arranged to receive the clock signal, and apply a programmable delay amount to the clock signal;
    a first delay control circuit, comprising a plurality of first transistors connected in parallel between a first node of the base delay circuit and a supply voltage, wherein a number of turned-on first transistors in the first delay control circuit is controlled by the setup-hold time control setting; and
    a second delay control circuit, comprising a plurality of second transistors connected in parallel between a second node of the base delay circuit and a ground voltage, wherein a number of turned-on second transistors in the second delay control circuit is controlled by the setup-hold time control setting;
    wherein the programmable delay amount is set by the number of turned-on first transistors in the first delay control circuit and the number of turned-on second transistors in the second delay control circuit.

5. The embedded memory of claim 1, wherein the programmable path delay circuit is arranged to control the path delay of the non-clock path according to the setup-hold time control setting.

6. The embedded memory of claim 5, wherein the programmable path delay circuit comprises:
    a delay cell circuit, arranged to apply a predetermined delay amount to the non-clock signal;
    a first multiplexer, having a first input port and a first output port, wherein the first input port is arranged to receive the non-clock signal without via the delay cell circuit, and the first output port is arranged to selectively output the non-clock signal received at the first input port according to the setup-hold time control setting; and a second multiplexer, having a second input port and a second output port, wherein the second input port is arranged to receive the non-clock signal via the delay cell circuit, and the second output port is arranged to selectively output the non-clock signal received at the second input port according to the setup-hold time control setting.

7. The embedded memory of claim 5, wherein the programmable path delay circuit comprises:
   a base delay circuit, arranged to receive the non-clock signal, and apply a programmable delay amount to the non-clock signal;
   a first delay control circuit, comprising a plurality of first transistors connected in parallel between a first node of the base delay circuit and a supply voltage, wherein a number of turned-on first transistors in the first delay control circuit is controlled by the setup-hold time control setting; and
   a second delay control circuit, comprising a plurality of second transistors connected in parallel between a second node of the base delay circuit and a ground voltage, wherein a number of turned-on second transistors in the second delay control circuit is controlled by the setup-hold time control setting;
   wherein the programmable delay amount is set by the number of turned-on first transistors in the first delay control circuit and the number of turned-on second transistors in the second delay control circuit.

8. The embedded memory of claim 5, wherein the non-clock signal is a control input received from a control pin included in the interface pins.

9. The embedded memory of claim 5, wherein the non-clock signal is an address bit received from an address pin included in the interface pins.

10. The embedded memory of claim 5, wherein the non-clock signal is a data bit received from a data input pin included in the interface pins.

* * * * *